United States Patent
Sun

(10) Patent No.: US 11,228,014 B2
(45) Date of Patent: Jan. 18, 2022

(54) OLED DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Jiajia Sun, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 242 days.

(21) Appl. No.: 16/632,901

(22) PCT Filed: Nov. 19, 2019

(86) PCT No.: PCT/CN2019/119311
§ 371 (c)(1),
(2) Date: Jan. 22, 2020

(87) PCT Pub. No.: WO2021/017322
PCT Pub. Date: Feb. 4, 2021

(65) Prior Publication Data
US 2021/0359246 A1    Nov. 18, 2021

(30) Foreign Application Priority Data
Jul. 30, 2019  (CN) .......................... 201910695007.2

(51) Int. Cl.
*H01L 51/52*      (2006.01)
*H01L 27/32*      (2006.01)
(Continued)

(52) U.S. Cl.
CPC ........ *H01L 51/5225* (2013.01); *H01L 27/326* (2013.01); *H01L 27/3234* (2013.01);
(Continued)

(58) Field of Classification Search
CPC ............. H01L 51/5225; H01L 51/5253; H01L 27/3234
See application file for complete search history.

(56) References Cited

U.S. PATENT DOCUMENTS

2012/0105400 A1*   5/2012  Mathew ................ G06F 1/1686
                                                      345/207
2013/0177302 A1*   7/2013  Weber ................... G06F 1/1626
                                                      396/155
(Continued)

FOREIGN PATENT DOCUMENTS

CN    107275361    10/2017
CN    109801950    5/2019
CN    110048005    7/2019

*Primary Examiner* — Douglas M Menz

(57) ABSTRACT

The present invention provides an organic light emitting diode (OLED) display panel and a manufacturing method of the OLED display panel. The present invention improves a light transmittance of an entire array layer by reducing the number of thin film transistors in an array layer under a camera-under-panel (CUP) region, and at the same time, patterning a cathode layer corresponding to a position of the CUP region to improve a light transmittance of the cathode layer, so that the CUP region can provide clear imaging, and the CUP region can also display images normally.

10 Claims, 6 Drawing Sheets

(51) Int. Cl.
*H01L 51/56* (2006.01)
*H01L 51/00* (2006.01)

(52) U.S. Cl.
CPC ...... *H01L 27/3246* (2013.01); *H01L 51/0097* (2013.01); *H01L 51/5253* (2013.01); *H01L 51/56* (2013.01); *H01L 2227/323* (2013.01); *H01L 2251/5338* (2013.01)

(56) References Cited

U.S. PATENT DOCUMENTS

| | | | |
|---|---|---|---|
| 2017/0187934 A1* | 6/2017 | Kwak | G02F 1/133512 |
| 2017/0289694 A1* | 10/2017 | Choi | G02F 1/1333 |
| 2017/0294155 A1 | 10/2017 | Kim | |
| 2019/0072822 A1* | 3/2019 | Yasunaga | G02B 6/0035 |
| 2020/0064681 A1* | 2/2020 | Son | G06F 1/1643 |
| 2020/0192148 A1* | 6/2020 | Kim | G02F 1/133512 |
| 2020/0212163 A1* | 7/2020 | Lou | H01L 27/3267 |
| 2020/0251539 A1 | 8/2020 | Fu | |
| 2020/0292871 A1* | 9/2020 | Inoue | G02F 1/133512 |
| 2020/0303472 A1* | 9/2020 | Lou | H01L 27/3288 |

* cited by examiner

US 11,228,014 B2

OLED DISPLAY PANEL AND MANUFACTURING METHOD THEREOF

RELATED APPLICATIONS

This application is a National Phase of PCT Patent Application No. PCT/CN2019/119311 having International filing date of Nov. 19, 2019, which claims the benefit of priority of Chinese Patent Application No. 201910695007.2 filed on Jul. 30, 2019. The contents of the above applications are all incorporated by reference as if fully set forth herein in their entirety.

FIELD AND BACKGROUND OF THE DISCLOSURE

The present invention relates to a field of display devices and in particular, to an organic light emitting diode (OLED) display panel and a manufacturing method thereof.

Organic Light Emitting Diode (OLED) devices have advantages such as light weight, wide viewing angles, fast response time, low operational temperatures, and high luminous efficiency compared with conventional liquid crystal displays (LCDs). OLED has been regarded as the next generation of new display technology, especially the OLED can be used to make a flexible display on the flexible substrate, which is a huge advantage of the OLED display panel. In order to improve a screen ratio of the OLED display panels, panel manufacturers have successively provided products having an in-screen hole. By placing a front camera under the in-screen hole, and removing a portion of an OLED film layer in an area corresponding to a camera-under-panel (CUP) region to ensure the front camera to receive sufficient light for capturing images. However, since the OLED film layer of the CUP region is removed, the area cannot display images.

Therefore, it is necessary to provide an OLED display panel that can display images in the CUP region to realize a true full screen for "CUP" products.

SUMMARY OF THE INVENTION

It is an objective of the present invention to provide an organic light emitting diode (OLED) display panel and a manufacturing method thereof to solve problems of conventional techniques.

To solve the above problem, the present invention provides an organic light emitting diode (OLED) display panel and a manufacturing method thereof.

According to one aspect of the present invention, the present invention provides an organic light emitting diode (OLED) display panel, wherein the OLED display panel is provided with a camera-under-panel (CUP) region, and the CUP region comprises a plurality of pixel units, and the OLED display panel comprises:
  a flexible substrate;
  an array layer disposed on the flexible substrate, wherein the array layer comprises a plurality of thin film transistors, and only one thin film transistor is disposed in a position corresponding to each pixel unit in the array layer;
  an anode layer disposed on the array layer and connected to the thin film transistors;
  a pixel defining layer and an organic light-emitting layer disposed spaced apart from each other on the anode layer; and
  a cathode layer disposed on the pixel defining layer and the organic light-emitting layer, the cathode layer comprising a patterned cathode portion and a non-patterned cathode portion, wherein the patterned cathode portion is disposed corresponding to the CUP region.

The display panel further comprises an encapsulation layer covering the cathode layer.

Each of the pixel units comprises first sub-pixels, a second sub-pixel, and a third sub-pixel; and anode portions respectively arranged corresponding to the first sub-pixels, the second sub-pixel, and the third sub-pixel are connected to each other through the anode layer.

The first sub-pixels are green sub-pixels, the second sub-pixel is a blue sub-pixel, and the third sub-pixel is a red sub-pixel, wherein a number of the first sub-pixels is two, a number of the second sub-pixels is one, a number of the third sub-pixels is one.

The patterned cathode portion comprises a plurality of sub-cathode portions, the sub-cathode portions are respectively disposed corresponding to the first sub-pixel, the second sub-pixels, and the third sub-pixel in the pixel unit; the sub-cathode portions are connected to each other, and the patterned cathode portion is connected to the non-patterned cathode portion.

According to another aspect of the present invention, the present invention provides a manufacturing method of an organic light emitting diode (OLED) display panel, wherein the manufacturing method is used for the OLED display panel, wherein the OLED display panel is provided with a camera-under-panel (CUP) region, the CUP region comprises a plurality of pixel units, and the manufacturing method comprises following steps:
  providing a flexible substrate;
  forming an array layer disposed on the flexible substrate, wherein the array layer comprises a plurality of thin film transistors, and only one thin film transistor is disposed in a position corresponding to each of the pixel units in the array layer;
  forming an anode layer disposed on the array layer;
  forming a pixel defining layer and an organic light-emitting layer on the anode layer;
  forming a cathode layer disposed on the pixel defining layer and the organic light-emitting layer, wherein a patterned cathode portion and a non-patterned cathode portion are formed in the cathode layer, and the patterned cathode portion is disposed corresponding to the CUP region; and
  forming an encapsulation layer on the cathode layer, wherein the encapsulation layer covers the cathode layer.

The anode layer is connected to the thin film transistor through a via hole defined in the array layer.

Each of the pixel units comprises first sub-pixels, a second sub-pixel, and a third sub-pixel; and anode portions respectively arranged corresponding to the first sub-pixels, the second sub-pixel, and the third sub-pixel are connected through the anode layer.

The first sub-pixels are green sub-pixels, the second sub-pixel is a blue sub-pixel, and the third sub-pixel is a red sub-pixel, wherein a number of the first sub-pixels is two, a number of the second sub-pixels is one, and a number of the third sub-pixels is one.

The patterned cathode portion comprises a plurality of sub-cathode portions; the sub-cathode portions are respectively disposed corresponding to the first sub-pixels, the second sub-pixel, and the third sub-pixel in the pixel unit;

the sub-cathode portions are connected to each other; and the patterned cathode portion is connected to the non-patterned cathode portion.

Advantages of the present invention: Compared with conventional techniques, the present invention improves a light transmittance of an entire array layer by reducing the number of the thin film transistors in the array layer under the camera-under-panel (CUP) region, and at the same time, patterning the cathode layer corresponding to a position of the CUP region to improve a light transmittance of the cathode layer, so that the CUP region can provide clear imaging, and the CUP region can also display images normally.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work.

DESCRIPTION OF SPECIFIC EMBODIMENTS OF THE INVENTION

Figure 1:
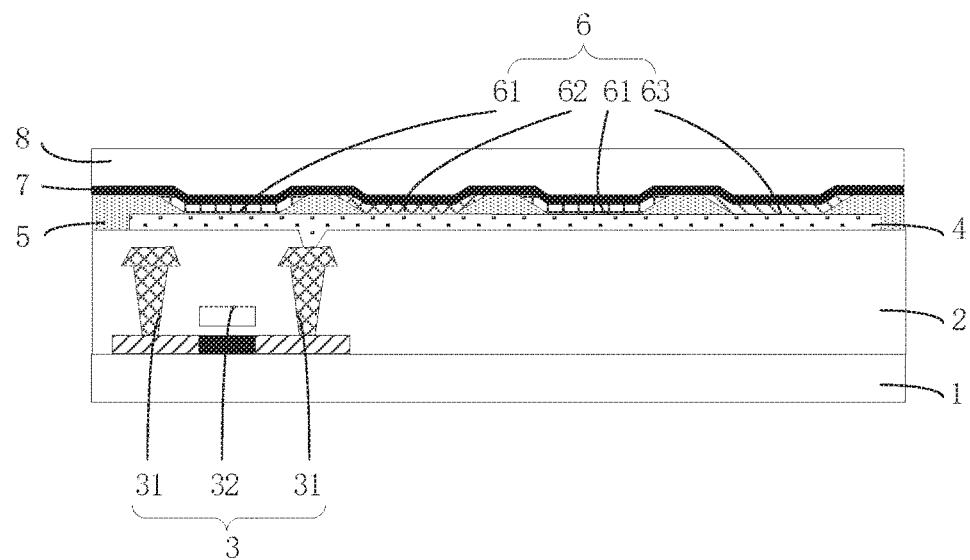
FIG. 1 is a schematic structural view illustrating an organic light emitting diode (OLED) display panel according to one embodiment of the present invention.

The technical solutions of the embodiments of the present invention will be clearly and completely described below with reference to the accompanying drawings. It is apparent that the embodiments are only some embodiments of the present invention, and not all of the embodiments. All other embodiments obtained by those skilled in the art based on the embodiments of the present disclosure without an inventive step are deemed to be within the protection scope of the present invention.

The terms "first", "second", "third", and so on (if there is any) in the specification and claims of the present disclosure and the accompanying drawings are used to distinguish similar objects, and are not necessarily used to describe a particular order or prioritization. It should be understood that the objects so described are interchangeable where appropriate. Moreover, the terms "comprising", "including", and similar terms are intended to mean a non-exclusive inclusion.

The accompanying drawings and various embodiments used to describe the working principles of the present disclosure are intended to be illustrative only and not to limit the protection scope of the present disclosure. Those skilled in the art will appreciate that the working principles of the present disclosure may be implemented in any suitably arranged system. Example embodiments are described in detail below with reference to the accompanying drawings. Further, products according to the example embodiments are described in detail with reference to the accompanying drawings. The same reference numerals in the drawings denote the same elements.

The terminology used in the description herein is for illustrative purposes and not intended to limit the concepts of the present invention. Expressions in the singular are intended to include the plural unless otherwise specified. In the present disclosure, it is to be understood that the terms such as "comprising", "including", and "containing" indicate the possibility of one or more other features, numbers, steps, moves, or combinations thereof, but does not preclude the inclusion of any other features, numbers, steps, moves, or combinations thereof. The same reference numerals in the drawings denote the same components.

Referring to FIG. 1, the present invention provides an organic light emitting diode (OLED) display panel, wherein the OLED display panel comprises: a flexible substrate 1, an array layer 2, an anode layer 4, a pixel defining layer 5, an organic light-emitting layer 6, first sub-pixels 61, second sub-pixels 62, third sub-pixels 63, a cathode layer 7, and an encapsulation layer 8.

The OLED display panel is provided with a camera-under-panel (CUP) region, and the CUP region comprises a plurality of pixel units. The pixel unit comprises the anode layer 4, the pixel defining layer 5, the organic light-emitting layer 6, and the cathode layer 7. Each of the pixel units comprises the first sub-pixels 61, the second sub-pixel 62, and the third sub-pixel 63. According to the present embodiment, the first sub-pixels 61 are green sub-pixels, the second sub-pixel 62 is a blue sub-pixel, and the third sub-pixel 63 is a red sub-pixel, wherein a number of the first sub-pixels 61 is two, a number of the second sub-pixels 62 is one, and a number of the third sub-pixels 63 is one. It should be noted that configurations of the pixel units are not limited to the manner provided in this embodiment, and may be any other suitable manner.

The array layer 2 is disposed on the flexible substrate 1. The array layer 2 comprises a plurality of thin film transistors 3, and only one thin film transistor 3 is disposed in a position corresponding to each of the pixel units in the array layer 2. This can reduce the number of metal lines, thereby increasing an overall light transmittance of the array layer 2, so that the CUP region can provide clear imaging, and the CUP region of the OLED display panel can also display images normally. The thin film transistor 3 includes a source/drain electrode 31 and a gate electrode 32. The array layer 2 is provided with a via hole arranged corresponding to the source/drain electrode 31 to facilitate connection with the anode layer 4.

The anode layer 4 is disposed on the array layer 2 and connected to the thin film transistors 3. The anode layer 4 is connected to the thin film transistor 3 through a via hole defined in the array layer 2. The anode layer 4 connects anode portions to each other, wherein the anode portions are arranged respectively corresponding to the first sub-pixels 61, the second sub-pixel 62, and the third sub-pixel 63. As a result, the four sub-pixels that can be illuminated independently are allowed to be illuminated at the same time. In other words, the two green sub-pixels, one blue sub-pixel, and one red sub-pixel simultaneously emit light, and the light emitted is a white light. Since all the sub-pixels in the pixel unit in the CUP region are turned on (illuminated) or turned off at the same time, the CUP region displays black-and-white images, and the CUP region can be used to display a status bar on an upper portion of the OLED display panel, which can be used to display patterns indicating, for example, power, 4G (i.e., the fourth generation of broadband cellular network technology) signal, alarm clock, and Bluetooth.

The pixel defining layer 5 and the organic light-emitting layer 6 are disposed spaced apart from each other on the anode layer 4.

Figure 2:
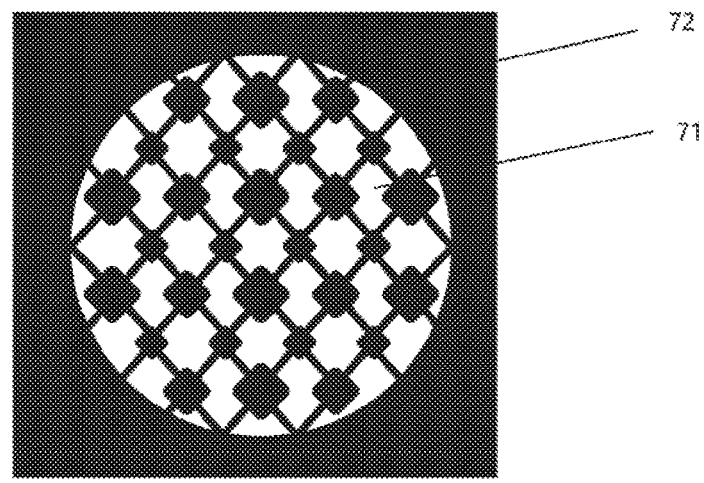
FIG. 2 is a schematic structural view illustrating a cathode layer under a camera-under-panel (CUP) region according to one embodiment of the present invention.

The cathode layer 7 is disposed on the pixel defining layer 5 and the organic light-emitting layer 6. The cathode layer 7 comprises a patterned cathode portion 71 and a non-patterned cathode portion 72, as shown in FIG. 2. The patterned cathode portion 71 is disposed corresponding to the CUP region. The cathode layer 7 is patterned to increase a light transmittance of the cathode layer 7, so that the CUP region can provide clear imaging, and the CUP region of the OLED display panel can also display images normally. In conventional techniques, a cathode is a metal layer with a coating on an entire surface to provide a light transmittance of only 40%. However, in the present disclosure, the cathode layer 7 is patterned to increase the light transmittance of the cathode layer 7.

In the present embodiment, the patterned cathode portion 71 comprises a plurality of sub-cathode portions. The sub-cathode portions are respectively disposed corresponding to the first sub-pixels 61, the second sub-pixel 62, and the third sub-pixel 63 in the pixel unit. The sub-cathode portions are connected to each other, and an edge of the patterned cathode portion 71 is connected to the non-patterned cathode portion 72 to thereby ensure that the entire cathode layer 7 of the OLED display panel is connected together.

Figure 3A:
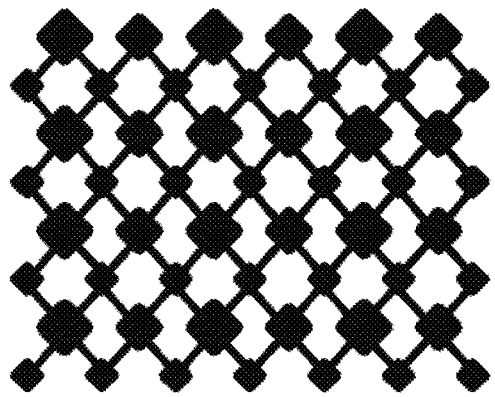
FIG. 3A is a schematic structural view illustrating a connection configuration of the cathode layer under the CUP region according to one embodiment of the present invention.
Figure 3B:
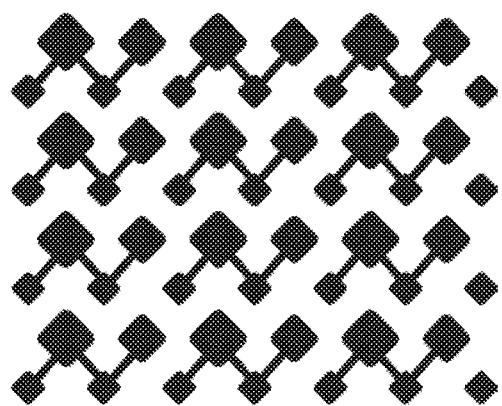
FIG. 3B is a schematic structural view illustrating a connection configuration of an anode layer under the CUP region according to one embodiment of the present invention.

As shown in FIG. 3A, the cathode of the sub-pixels under the CUP region can be connected linearly. As shown in FIG. 3B, the anode of the sub-pixels under the CUP region can be connected linearly.

Figure 4A:
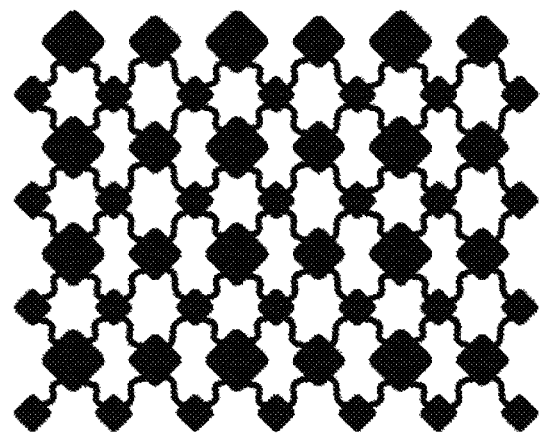
FIG. 4A is a schematic structural view illustrating a connection configuration of the cathode layer under the CUP region according to another embodiment of the present invention.
Figure 4B:
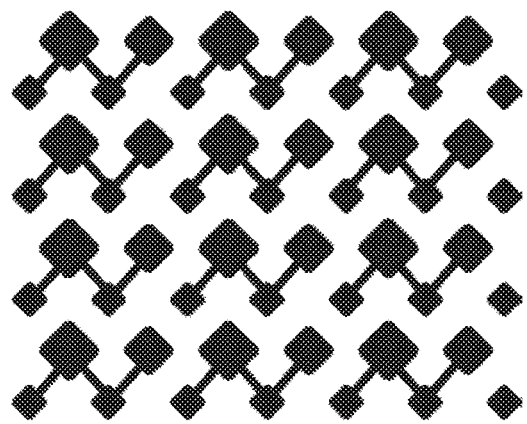
FIG. 4B is a schematic structural view illustrating a connection configuration of the anode layer under the CUP region according to another embodiment of the present invention.

As shown in FIG. 4A, the cathode of the sub-pixels under the CUP region can be connected in a non-linear manner. As shown in FIG. 4B, the anode of the sub-pixels under the CUP region can be connected linearly.

Figure 5A:
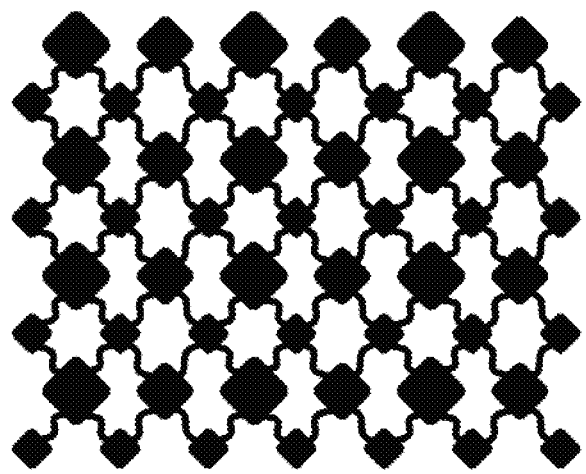
FIG. 5A is a schematic structural view illustrating a connection configuration of the cathode layer under the CUP region according to still another embodiment of the present invention.
Figure 5B:
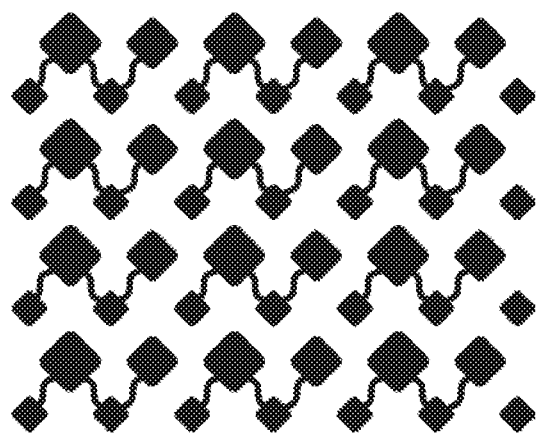
FIG. 5B is a schematic structural view illustrating a connection configuration of the anode layer under the CUP region according to still another embodiment of the present invention.

As shown in FIG. 5A, the cathode of the sub-pixels under the CUP region can be connected in a non-linear manner. As shown in FIG. 5B, the anode of the sub-pixels under the CUP region can be connected in a non-linear manner.

Figure 6:
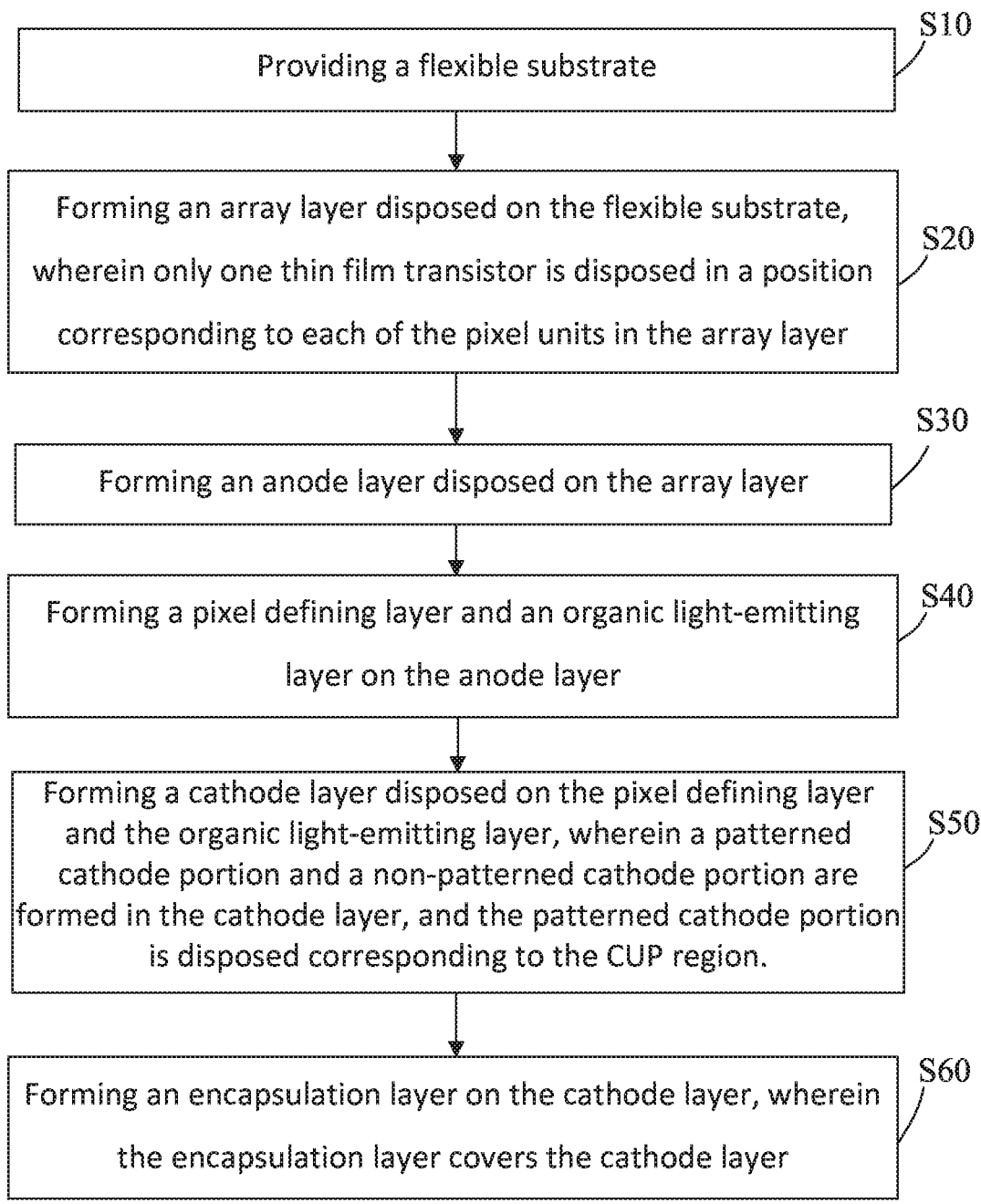
FIG. 6 is a process flow diagram illustrating a manufacturing method of the OLED display panel according to one embodiment of the present invention.
Figure 7:
FIGS. 7, 8, 9, 10, 11 and 12 are schematic views illustrating the manufacturing method of the OLED display panel according to one embodiment of the present invention.

Referring to FIG. 6, the present invention provides a manufacturing method of an organic light emitting diode (OLED) display panel, wherein the manufacturing method is used for the OLED display panel, wherein the OLED display panel is provided with a camera-under-panel (CUP) region, the CUP region comprises a plurality of pixel units, and the manufacturing method comprises following steps:

Step S10: providing a flexible substrate, as shown in FIG. 7.

Figure 8:

Step S20: forming an array layer disposed on the flexible substrate, wherein the array layer comprises a plurality of thin film transistors, and only one thin film transistor is disposed in a position corresponding to each of the pixel units in the array layer, as shown in FIG. 8.

Specifically, only one thin film transistor is disposed in a position corresponding to each pixel unit in the array layer, thereby reducing the number of metal lines, and improving an overall light transmittance of the array layer 2, so that the CUP region can provide clear imaging, and the CUP region of the OLED display panel can also display images normally. The thin film transistor 3 includes a source/drain electrode 31 and a gate electrode 32. The array layer 2 is provided with a via hole arranged corresponding to the source/drain electrode 31 to facilitate connection with an anode layer 4.

Figure 9:
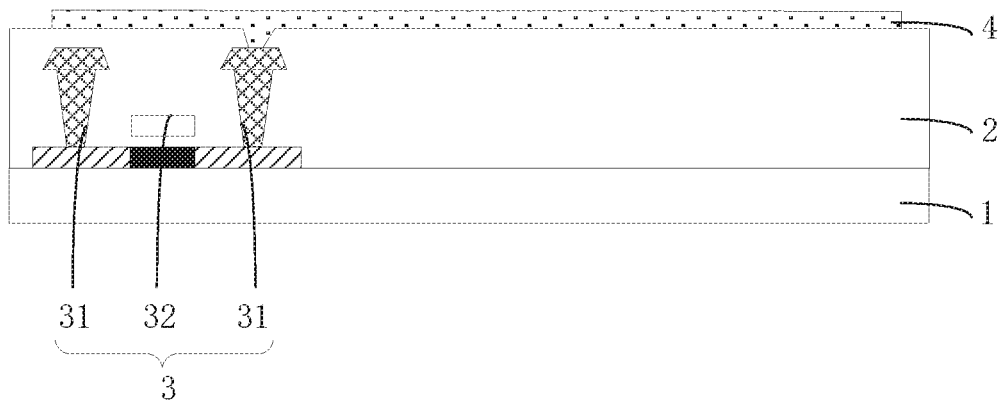

Step S30: forming the anode layer disposed on the array layer, as shown in FIG. 9. The anode layer 4 is connected to the thin film transistor 3 through the via hole defined in the array layer 2.

In addition, the anode layer 4 can also connect the anode portions to each other corresponding to the first sub-pixels 61, the second sub-pixel 62, and the third sub-pixel 63 through etching or using a mask, so that the four sub-pixels that can be independently illuminated are illuminated at the same time. In other words, two green sub-pixels, one blue sub-pixel and one red sub-pixel emit light at the same time, and the light emitted is a white light. Since all the sub-pixels in the pixel unit in the CUP region are turned on (illuminated) or turned off at the same time, the CUP region displays black-and-white images, and the CUP region can be used to display a status bar on an upper portion of the OLED display panel, which can be used to display patterns indicating, for example, power, 4G (i.e., the fourth generation of broadband cellular network technology) signal, alarm clock, and Bluetooth.

Figure 10:
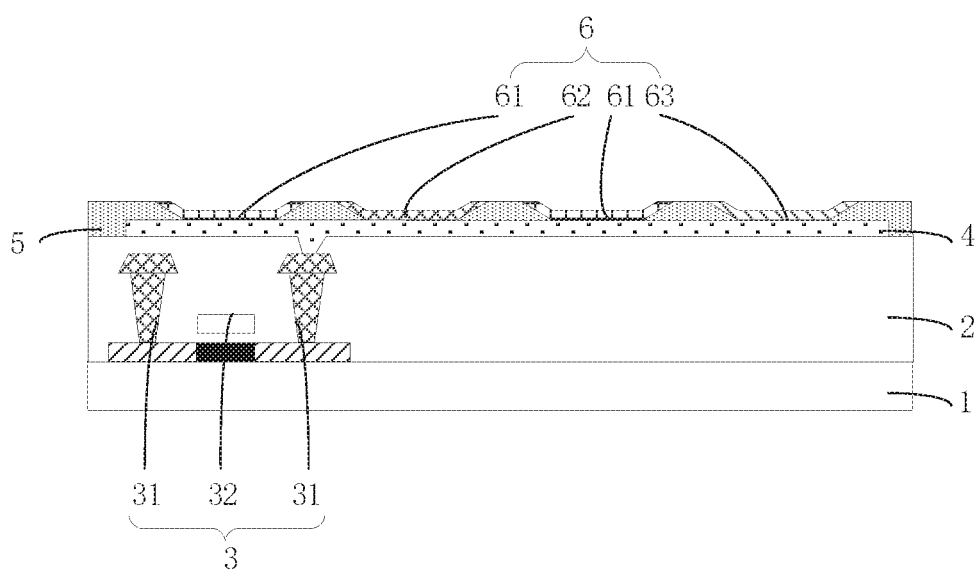

Step S40: forming a pixel defining layer and an organic light-emitting layer on the anode layer, as shown in FIG. 10.

Figure 11:
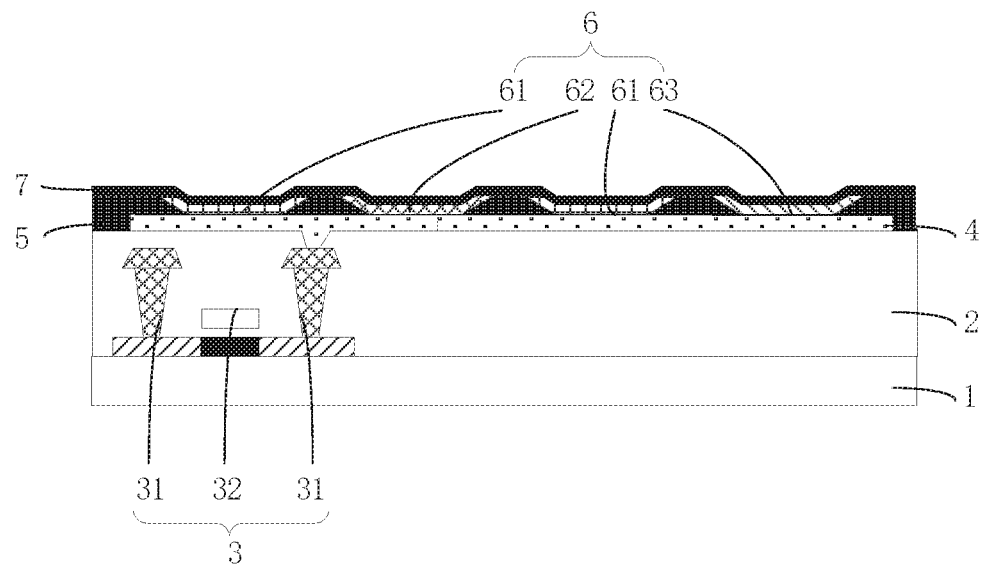

Step S50: forming a cathode layer disposed on the pixel defining layer and the organic light-emitting layer, wherein a patterned cathode portion and a non-patterned cathode portion are formed in the cathode layer, and the patterned cathode portion is disposed corresponding to the CUP region, as shown in FIG. 11.

As shown in FIG. 2, the cathode layer 7 is obtained by etching or using a mask to obtain the patterned cathode portion 71 and the non-patterned cathode portion 72. The patterned cathode portion 71 is disposed corresponding to the CUP region, and the cathode layer 7 is patterned to increase the light transmittance of the cathode layer 7, so that the CUP region can provide clear imaging, and the CUP region of the OLED display panel can also display images normally. In conventional techniques, a cathode is a metal layer with a coating on an entire surface and provides a light transmittance of only 40%. However, in the present invention, the cathode is patterned to increase the light transmittance of the cathode layer 7.

In the present embodiment, the patterned cathode portion 71 comprises a plurality of sub-cathode portions, and the sub-cathode portions are respectively disposed corresponding to the first sub-pixels 61, the second sub-pixel 62, and the third sub-pixel 63 in the pixel unit. The sub-cathode portions are connected to each other to keep the feature that the sub-cathode portions of the sub-pixels are electrically connected to each other. An edge of the patterned cathode portion 71 is connected to the non-patterned cathode portion 72 to ensure that the whole cathode layer 7 of the OLED display panel is joined together.

Figure 12:
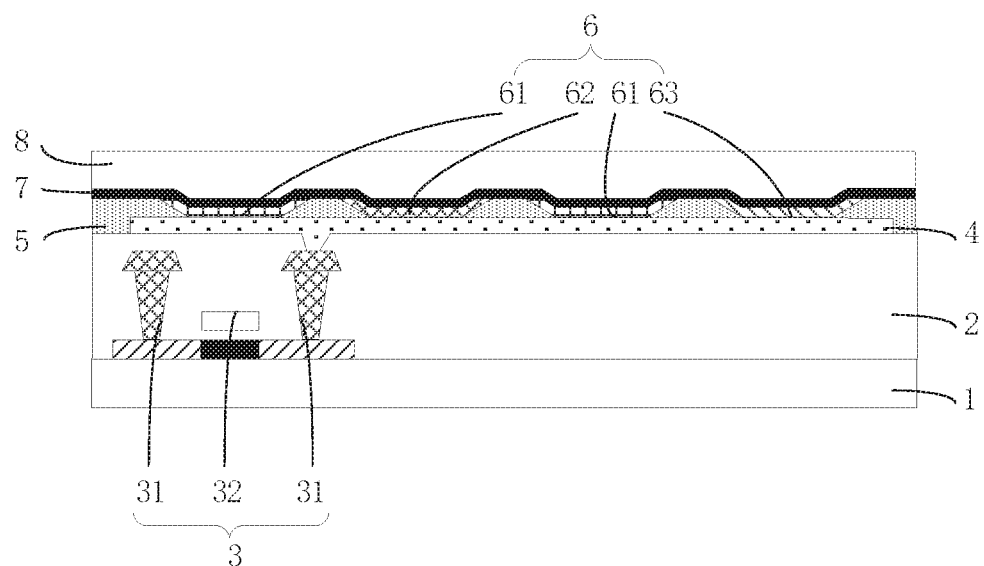

Step S60: forming an encapsulation layer on the cathode layer, wherein the encapsulation layer covers the cathode layer, as shown in FIG. 12. The encapsulation layer 8 is used to prevent the cathode layer 7 from being corroded.

The present invention improves the light transmittance of the entire array layer by reducing the number of thin film transistors in the array layer under the CUP region, reducing the number of metal lines, and patterning the cathode layer in a position corresponding to the CUP region to improve the light transmittance of the cathode layer, so that the CUP region provides clear imaging, and the CUP region of the OLED display panel can also normally display images.

The OLED display panel and the manufacturing method thereof are described above in detail, and the working principles and embodiments of the present invention are illustrated. The above description is only provided for ease of understanding of the present disclosure and its main ideas. Those skilled in the art will be able to modify the embodiments and their application range. All such changes/modifications should be deemed to be within the protection scope of the present invention. In conclusion, the content of the present specification should not be construed as limiting the present invention.

What is claimed is:

1. An organic light emitting diode (OLED) display panel, wherein the OLED display panel is provided with a camera-under-panel (CUP) region, and the CUP region comprises a plurality of pixel units, and the OLED display panel comprises:
    a flexible substrate;
    an array layer disposed on the flexible substrate, wherein the array layer comprises a plurality of thin film transistors, and only one thin film transistor is disposed in a position corresponding to each pixel unit in the array layer;
    an anode layer disposed on the array layer and connected to the thin film transistors;
    a pixel defining layer and an organic light-emitting layer disposed spaced apart from each other on the anode layer; and
    a cathode layer disposed on the pixel defining layer and the organic light-emitting layer, the cathode layer comprising a patterned cathode portion and a non-patterned cathode portion, wherein the patterned cathode portion is disposed corresponding to the CUP region.

2. The OLED display panel according to claim 1, wherein the display panel further comprises an encapsulation layer covering the cathode layer.

3. The OLED display panel according to claim 1, wherein each of the pixel units comprises first sub-pixels, a second sub-pixel, and a third sub-pixel; and anode portions respectively arranged corresponding to the first sub-pixels, the second sub-pixel, and the third sub-pixel are connected to each other through the anode layer.

4. The OLED display panel according to claim 3, wherein the first sub-pixels are green sub-pixels, the second sub-pixel is a blue sub-pixel, and the third sub-pixel is a red sub-pixel, wherein a number of the first sub-pixels is two, a number of the second sub-pixels is one, a number of the third sub-pixels is one.

5. The OLED display panel according to claim 4, wherein the patterned cathode portion comprises a plurality of sub-cathode portions; the sub-cathode portions are respectively disposed corresponding to the first sub-pixel, the second sub-pixels, and the third sub-pixel in the pixel unit; the sub-cathode portions are connected to each other; and the patterned cathode portion is connected to the non-patterned cathode portion.

6. A manufacturing method of an organic light emitting diode (OLED) display panel, wherein the manufacturing method is used for the OLED display panel, wherein the OLED display panel is provided with a camera-under-panel (CUP) region, the CUP region comprises a plurality of pixel units, and the manufacturing method comprises following steps:
    providing a flexible substrate;
    forming an array layer disposed on the flexible substrate, wherein the array layer comprises a plurality of thin film transistors, and only one thin film transistor is disposed in a position corresponding to each of the pixel units in the array layer;
    forming an anode layer disposed on the array layer;
    forming a pixel defining layer and an organic light-emitting layer on the anode layer;
    forming a cathode layer disposed on the pixel defining layer and the organic light-emitting layer, wherein a patterned cathode portion and a non-patterned cathode portion are formed in the cathode layer, and the patterned cathode portion is disposed corresponding to the CUP region; and
    forming an encapsulation layer on the cathode layer, wherein the encapsulation layer covers the cathode layer.

7. The manufacturing method of the OLED display panel according to claim 6, wherein the anode layer is connected to the thin film transistor through a via hole defined in the array layer.

8. The manufacturing method of the OLED display panel according to claim 6, wherein each of the pixel units comprises first sub-pixels, a second sub-pixel, and a third sub-pixel; and anode portions respectively arranged corresponding to the first sub-pixels, the second sub-pixel, and the third sub-pixel are connected through the anode layer.

9. The manufacturing method of the OLED display panel according to claim 8, wherein the first sub-pixels are green sub-pixels, the second sub-pixel is a blue sub-pixel, and the third sub-pixel is a red sub-pixel, wherein a number of the first sub-pixels is two, a number of the second sub-pixels is one, and a number of the third sub-pixels is one.

10. The manufacturing method of the OLED display panel according to claim 6, wherein the patterned cathode portion comprises a plurality of sub-cathode portions; the sub-cathode portions are respectively disposed corresponding to the first sub-pixels, the second sub-pixel, and the third sub-pixel in the pixel unit; the sub-cathode portions are connected to each other; and the patterned cathode portion is connected to the non-patterned cathode portion.

* * * * *